United States Patent
Nowodzinski

(10) Patent No.: US 12,055,450 B2
(45) Date of Patent: Aug. 6, 2024

(54) DETECTION DEVICE HAVING A PIEZORESISTIVE ELEMENT HAVING INCREASED CAPACITANCE

(71) Applicant: COMMISSARIAT A L'ENERGIE ATOMIQUE ET AUX ENERGIES ALTERNATIVES, Paris (FR)

(72) Inventor: Antoine Nowodzinski, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 150 days.

(21) Appl. No.: 17/317,963

(22) Filed: May 12, 2021

(65) Prior Publication Data
US 2021/0356336 A1 Nov. 18, 2021

(30) Foreign Application Priority Data
May 14, 2020 (FR) .................................... 20 04767

(51) Int. Cl.
*G01L 1/18* (2006.01)
*B81B 3/00* (2006.01)

(52) U.S. Cl.
CPC .............. *G01L 1/18* (2013.01); *B81B 3/0021* (2013.01); *B81B 2201/0264* (2013.01)

(58) Field of Classification Search
CPC .. G01P 15/125; G01P 15/123; G01C 19/5733
See application file for complete search history.

(56) References Cited

U.S. PATENT DOCUMENTS

| | | | |
|---|---|---|---|
| 4,951,510 A * | 8/1990 | Holm-Kennedy | ............................ G01P 15/0802 73/514.31 |
| 5,060,504 A * | 10/1991 | White | ................. G01P 15/0802 73/1.38 |
| 5,081,867 A * | 1/1992 | Yamada | ................. G01P 15/123 73/514.33 |
| 5,121,180 A * | 6/1992 | Beringhause | ....... G01P 15/0802 73/768 |
| 5,417,115 A * | 5/1995 | Burns | .................... G01P 15/097 73/702 |
| 5,518,951 A * | 5/1996 | Paynter | ................. G01L 1/2293 438/50 |
| 5,526,687 A * | 6/1996 | Ueyanagi | .............. G01P 15/124 73/514.16 |
| 5,542,297 A * | 8/1996 | Mizuno | ................. G01P 15/123 73/514.36 |

(Continued)

OTHER PUBLICATIONS

French Preliminary Search Report issued Feb. 3, 2021 in French Application 20 04767 filed on May 14, 2020, 11 pages(with English Translation of Categories of Cited Documents & Written Opinion).

(Continued)

*Primary Examiner* — Tran M. Tran
(74) *Attorney, Agent, or Firm* — Oblon, McClelland, Maier & Neustadt, L.L.P.

(57) ABSTRACT

A transduction detection device includes a substrate and a strain gauge suspended above a face of the substrate having a piezoresistive element. At least one portion of the surface of the piezoresistive element is covered by a stack having, successively from the surface of the piezoresistive element, a dielectric layer and an electrically conductive layer.

12 Claims, 5 Drawing Sheets

(56) References Cited

U.S. PATENT DOCUMENTS

| | | | | |
|---|---|---|---|---|
| 5,554,875 A | * | 9/1996 | Hartauer | G01P 15/125 257/618 |
| 5,672,551 A | * | 9/1997 | Fung | G01L 9/0042 148/DIG. 136 |
| 5,801,309 A | * | 9/1998 | Carr | G01P 15/125 73/514.29 |
| 5,974,898 A | * | 11/1999 | Golderer | G01L 1/142 73/862.043 |
| 6,389,899 B1 | * | 5/2002 | Partridge | G01P 15/0802 73/514.36 |
| 6,854,330 B2 | * | 2/2005 | Potter | G01P 15/125 310/309 |
| 7,280,014 B2 | * | 10/2007 | Potter | H01H 59/0009 335/78 |
| 7,284,452 B2 | * | 10/2007 | Thaysen | G01N 29/036 73/862.639 |
| 7,578,162 B2 | * | 8/2009 | Okada | G01L 1/148 73/1.38 |
| 8,109,144 B2 | * | 2/2012 | Kawakubo | G01P 15/0802 73/504.12 |
| 8,174,352 B2 | * | 5/2012 | Parpia | B81C 1/00246 73/204.26 |
| 8,187,903 B2 | * | 5/2012 | Yama | G01P 15/0802 438/52 |
| 8,371,166 B2 | * | 2/2013 | Robert | G01C 19/5656 73/504.12 |
| 8,479,585 B2 | * | 7/2013 | Shaw-Klein | H10N 30/302 73/777 |
| 8,569,934 B2 | * | 10/2013 | Koops | H01L 41/332 29/25.35 |
| 8,991,253 B2 | * | 3/2015 | Theuss | G01P 15/08 73/514.35 |
| 9,052,332 B2 | * | 6/2015 | Huang | G01P 15/0802 |
| 9,110,090 B2 | * | 8/2015 | Neul | G01P 15/0802 |
| 9,146,252 B2 | * | 9/2015 | Robert | G01P 15/0802 |
| 9,325,291 B2 | * | 4/2016 | Hentz | H03H 9/02259 |
| 9,382,108 B2 | * | 7/2016 | Duraffourg | B81B 3/0086 |
| 9,702,893 B2 | * | 7/2017 | Robert | G01P 15/123 |
| 9,970,831 B2 | * | 5/2018 | Shih | G01L 1/16 |
| 10,184,951 B2 | * | 1/2019 | Chatterjee | G01P 15/0802 |
| 10,345,176 B2 | * | 7/2019 | Fain | H04R 19/005 |
| 10,418,183 B2 | * | 9/2019 | Hattori | H05K 3/3436 |
| 11,041,992 B2 | * | 6/2021 | Dagher | G02B 6/3518 |
| 11,085,945 B2 | * | 8/2021 | Joet | G01P 15/123 |
| 11,125,632 B2 | * | 9/2021 | Rey | G01C 19/5755 |
| 11,186,481 B2 | * | 11/2021 | Yang | G01P 15/125 |
| 2006/0060003 A1 | | 3/2006 | Thaysen | |
| 2009/0139342 A1 | * | 6/2009 | Robert | G01P 15/097 73/818 |
| 2010/0043552 A1 | * | 2/2010 | Stenbock Andersen | G01P 15/18 73/514.29 |
| 2011/0115038 A1 | * | 5/2011 | Kanemoto | G01P 15/125 257/E21.214 |
| 2013/0205899 A1 | * | 8/2013 | Wu | G01P 1/00 73/510 |
| 2015/0241465 A1 | * | 8/2015 | Konishi | G01L 9/0044 73/514.33 |
| 2018/0310411 A1 | * | 10/2018 | Kasper | G01P 1/023 |

OTHER PUBLICATIONS

Robert et al., "M&NEMS: A new approach for ultra-low cost 3D inertial sensor", 2009 IEEE Sensors, Oct. 1, 2009, pp. 963-966.

Nowodzinski et al., "1/f noise characterization of piezoresistive nano-gauges for MEMS sensors", 2018 IEEE Sensors, Oct. 28, 2018, pp. 1-4.

Harley et al., "1/F Noise Considerations for the Design and Process Optimization of Piezoresistive Cantilevers", Journal of Microelectromechanical Systems, vol. 9, No. 2, Jun. 1, 2000, pp. 226-235.

Yu et al., "Optimization of sensitivity and noise in piezoresistive cantilevers", Journal of Applied Physics, vol. 92, No. 10, Nov. 15, 2002, pp. 6296-6301.

Langfelder et al., "Linearity of Piezoresistive Nano-Gauges for MEMS Sensors", Procedia Engineering 87, 2014, pp. 1469-1472.

El-Sheimy et al., "Analysis and Modeling of Inertial Sensors Using Allan Variance", IEEE Transactions on Instrumentation and Measurement, vol. 57, No. 1, Jan. 2008, pp. 140-149.

Reimbold, "Modified 1/f Trapping Noise Theory and Experiments in MOS Transistors Biased from Weak to Strong Inversion-Influence of Interface States", IEEE Transactions on Electron Devices, vol. ed-31, No. 9, Sep. 1984, pp. 1190-1198.

Simoen et al., "Random telegraph noise: The key to single defect studies in nano-devices", Thin-Solid Films 613, 2016, pp. 2-5.

Elmasry, "Capacitance Calculations in MOSFET VLSI", IEEE Electron Device Letters, vol. edl-3, No. 1, Jan. 1982, pp. 6-7.

Huang et al., "Investigation of gate-all-around silicon nanowire transistors for ultimately scaled CMOS technology from top-down approach", Front. Phys. China, 5(4), 2010, pp. 414-421.

Veloso et al., "Advances on doping strategies for triple-gate finFETs and lateral gate-all-around nanowire FETs and their impact on device performance", Materials Science in Semiconductor Processing 62, 2017, pp. 2-12.

\* cited by examiner

DETECTION DEVICE HAVING A PIEZORESISTIVE ELEMENT HAVING INCREASED CAPACITANCE

TECHNICAL FIELD

The present invention concerns the field of piezoresistive detection devices.

In general, this type of device involves the transduction capacitance of piezoresistive materials. These may be inertial sensors of the accelerometer, single-axis or multi-axis gyroscope or gyrometer type, or even pressure sensors, magnetometers or microphones. This concerns the sensors in the form of microelectronic devices. The term "microelectronic device" means any type of device made with the means of microelectronics. These devices include micromechanical or electromechanical devices (MEMS, NEMS, etc.).

TECHNOLOGICAL BACKGROUND

The piezoresistive nanogauges are used in numerous MEMS sensors as transducers between a mechanical quantity to be measured (pressure, acceleration, rotation) and an electrical quantity usable in electronics (voltage, current or resistance). This type of transduction uses the piezoresistivity of a gauge to convert a mechanical stress into a change in electrical resistance.

FIG. 1 shows an example of a known detection device, herein an accelerometer (but one could also take as an example a gyrometer in a similar manner), in which a mass 2, having a centre of gravity G, is mounted movable relative to a substrate, for example based on silicon. In the present case, one seeks to measure a rotational displacement of the movable mass 2 in the plane XY of the represented orthogonal reference frame XYZ, that is to say a rotation about an axis in the direction Z, as indicated by the circular arrow portion in FIG. 1. In this example, the mass 2 is movable in this direction of rotation thanks to hinges 4 which connect, with a freedom of rotational movement along Z, the mass 2 to an anchoring area 12 integrated into the substrate.

The rotational movement can be translated into an electrical value via a strain gauge 3 using the ability of a piezoresistive material to convert a mechanical quantity into an electrical quantity, and, in a primary manner, into a variation in electrical resistance. In the represented case, the gauge 3 has the shape of a beam, a first end 36 of which is anchored on an embedded area 11 integrated into the substrate 1 and the other end 37 of which is anchored on the movable mass 2. The beam of the gauge 3 has a length dimension directed in the direction Y.

It is understood that a movement of the mass 2 in the plane XY will produce a deformation of the gauge 3, herein essentially in tension/compression, which will induce a variation in electrical resistance of the piezoresistive material of the gauge 3, a variation in electrical resistance which can be measured by a measuring circuit. The latter can for example detect a variation in the ratio between the current circulating in the gauge and the voltage between the gauge and the substrate over time, so as to evaluate the variation in resistance.

The signal to noise ratio of the final sensor depends in part on the performances of the transduction. For the nanogauges, the maximum signal which can be converted into a variation in resistance is limited by the elastic limit of the nanogauges while the noise of the sensor is penalised by the noise of the nanogauges.

Two types of noise dominate this type of piezoresistive gauge transducers.

The first type corresponds to Johnson noise, or even white noise, most often of thermal origin, of constant amplitude spectral density.

Flicker noise corresponds to the second type of noise, and its amplitude spectral density is of the $A \cdot f^{\alpha}$ type, f being the frequency, A being the noise spectral density at 1 Hz and a being a constant comprised between 0.4 and 0.6 (when the noise is expressed in amplitude spectral density). This noise is therefore of the 1/f type, which makes it all the more penalising at low frequencies, in particular for long acquisitions.

The impact of these two types of noise on the resolution of the sensor is very different, and can be analysed in the time domain as a function of the integration time, by the Allan standard deviation. The maximum resolution of a sensor will be given by the minimum Allan standard deviation (or variance) and this is directly limited by the second type of noise.

FIG. 2A shows an evolution of the amplitude spectral density of the noise of a piezoresistive gauge gyrometer. On this curve, one notes a constant level of white noise, corresponding to the level of line D1, in the present case at $20°/h/Hz^{0.5}$. The second type of noise, 1/f noise, corresponds to direction D2 and results in a value of $3°/h/Hz^{0.5}$, at a frequency of 1 Hz.

FIG. 2B shows, for its part, the evolution of the Allan standard deviation as a function of the integration time. For relatively low integration times, white noise predominates, as revealed by the slope D3, the Allan standard deviation linearly decreasing, with a slope in the range of −0.5, with the integration time. The curve then adopts a very different behaviour, revealing the influence of 1/f noise for longer integration times, for example beyond one second.

The scientific publication Ph. ROBERT et Al "M&NEMS: A new approach for ultra-low cost 3D inertial sensor" 2009 IEEE SENSORS, of 1 Oct. 2009, pages 963-966, XP055023740, presents an inertial sensor provided with a piezoelectric beam. The noise reduction is a problem in this type of sensor.

There is therefore a need to propose detection devices with piezoresistive operation which proposes a reduction of noise, and in particular 1/f noise, which is particularly penalising at low frequencies.

The other objects, features and advantages of the present invention will appear on examining the following description and the appended drawings. It is understood that other advantages can be incorporated.

SUMMARY

In order to achieve this objective, according to one embodiment, a transduction detection device, comprising a substrate and a strain gauge suspended above a face of the substrate and comprising a piezoresistive element. The gauge advantageously comprises a first end anchored relative to the substrate and a second end anchored relative to a mass which is movable relative to the substrate.

Advantageously, at least one portion of the surface of the piezoresistive element is covered by a stack comprising, successively from the surface of the piezoresistive element, a dielectric layer and an electrically conductive layer.

Thus, with the piezoresistive material, a capacitive assembly is formed, the capacitance of which is added to, or replaces, that produced between said material and the substrate, with as an air gap at least one air layer and possibly other insulating layers, such as an oxide layer on the surface of the substrate. The created additional capacitance has the effect of increasing the total capacitance between the substrate and the suspended gauge.

The applicant has in fact observed that the increase in the overall capacitance allows limiting the influence of the phenomena of absorption and relaxation of charges in the piezoresistive material of the gauge. As described below, these phenomena generate voltage jumps at the gauge which are synonyms of noise at each occurrence.

BRIEF DESCRIPTION OF THE FIGURES

The aims, objects, as well as the features and advantages of the invention will emerge better from the detailed description of an embodiment of the latter which is illustrated by the following accompanying drawings in which.

Figure 1:
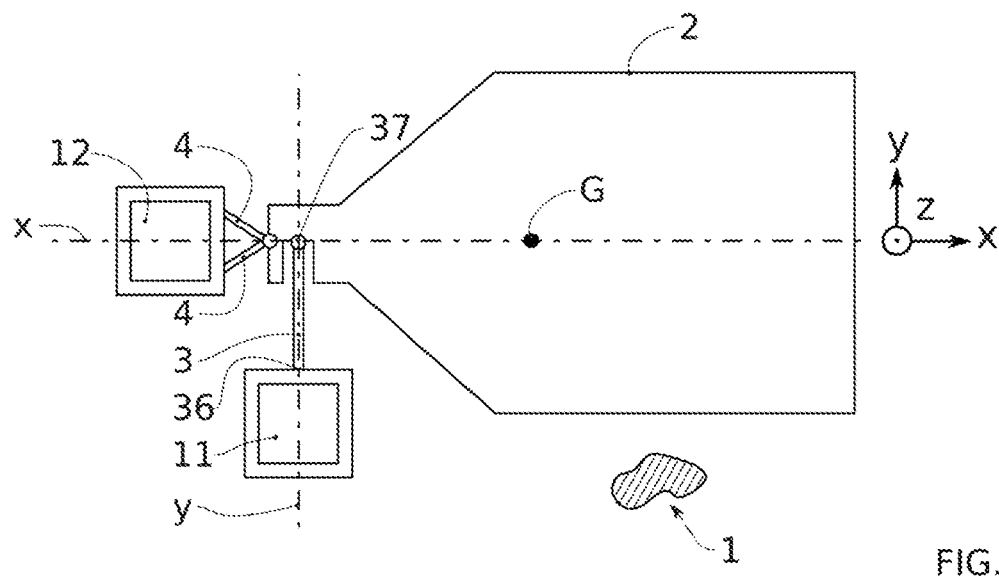
FIG. 1 represents an example of a known structure of a detection device in the form of an accelerometer.
Figure 2A:
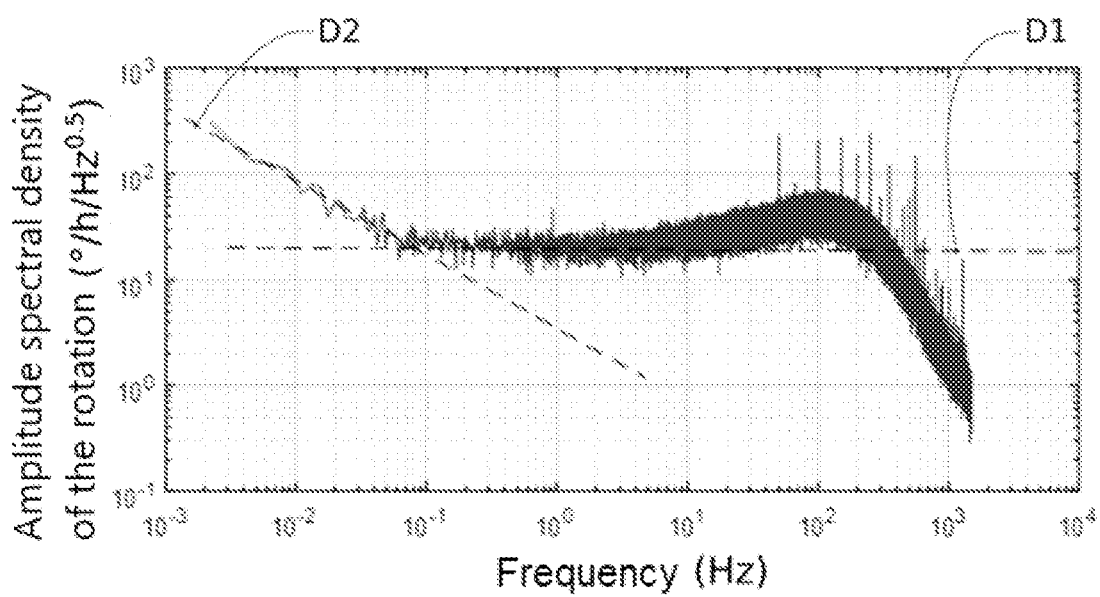
FIG. 2A represents the evolution of the amplitude spectral density of the noise of a gyrometer, in $°/h/Hz^{0.5}$, as a function of the frequency in Hz.
Figure 2B:
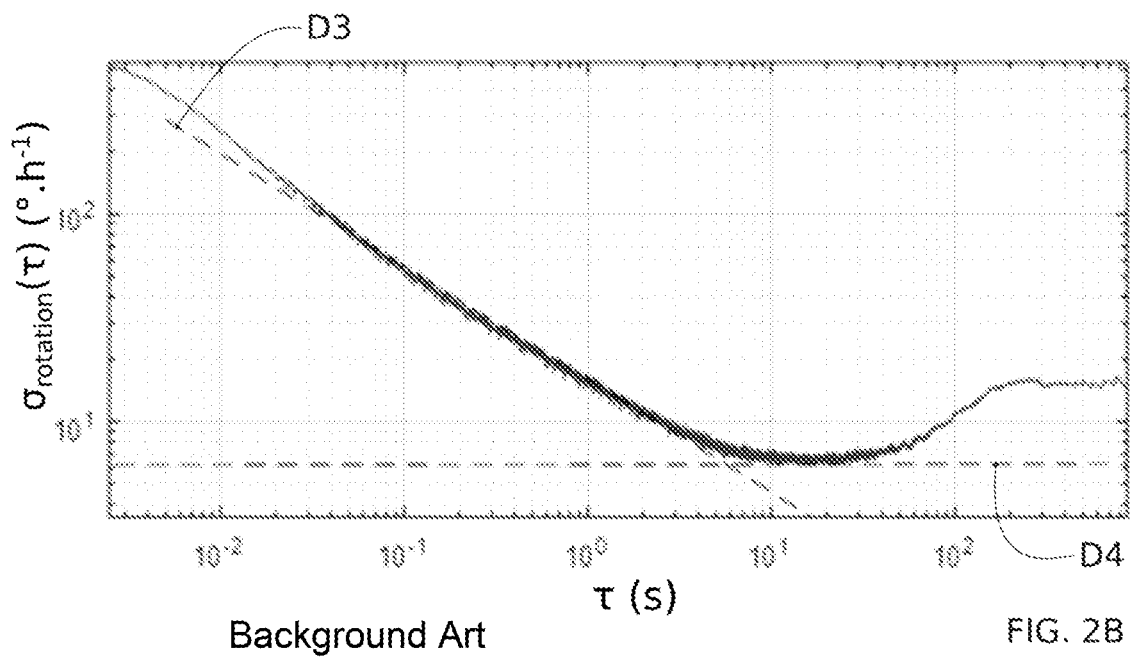
FIG. 2B represents the evolution of the Allan standard deviation, expressed in $°.h^{-1}$, as a function of the integration time expressed in seconds, for the gyrometer of FIG. 2A.

The drawings are given by way of examples and are not limiting of the invention. They constitute schematic representations of principle intended to facilitate the understanding of the invention and are not necessarily on the scale of the practical applications.

DETAILED DESCRIPTION

Before starting a detailed review of embodiments of the invention, optional features are set out below which can possibly be used in combination or alternatively:

According to one example, the electrical capacitance formed by the piezoresistive element and the stack has a value greater than that of a capacitor formed between the piezoresistive element and the substrate. In general, when the stack leads to the formation of one or more capacitance(s) operating in parallel with the usual capacitance of the resistive element with the substrate, the overall capacitance is always increased. In this case, it remains interesting that the additional capacitive value provided by the stack is significant, and preferably greater than the usual capacitance of the resistive element with the substrate, such that the overall capacitance is high. In the case where the stack is such that the usual capacitance between the resistive element and the substrate no longer exists, typically when the stack covers the lower face of the resistive element, it is desirable that the overall capacitance produced by the stack is greater than that which would have existed without its presence. Thus, in all cases, the value of the electrical capacitance relative to the substrate is increased.

According to one possibility, the covered part comprises a surface portion of the piezoresistive element which is opposite to the face of the substrate; this situation is favourable to the ease of manufacture, to the extent that the stack can be formed at this level in a simple manner, the opposite face in question being exposed outwardly, which can facilitate the layer deposition phase.

According to another possibility, the covered part comprises a surface portion of the piezoresistive element facing the face of the substrate; this option allows replacing the usual capacitance between the resistive element and the substrate.

According to one example, the piezoresistive element is a beam; the geometric structure thereof can facilitate the formation of the stack. The beam might comprise a section of rectangular, even square, type, capable of creating sides which can be completely or partially covered by the stack; it is understood that the device can comprise a plurality of gauges which can each comprise at least one piezoresistive beam.

Possibly, the beam extends over the entire length of the gauge, between the first and second ends thereof; in general, the resistive element is preferably extended along the entire dimension of the gauge.

According to one possibility, the covered part extends along the entire length dimension of the piezoresistive element; this case is favourable to the increase in the capacitance, which is directly proportional to the increase in the surface area of the stack.

In one embodiment, the dielectric layer is made of a material based on silicon oxide or nitride.

The electrically conductive layer may in turn be based on doped silicon or a metal.

In one embodiment, the gauge comprises a first end anchored relative to the substrate; this anchoring can be carried out during the constitution of the piezoresistive element which then has one end anchored in the substrate.

According to one example, the gauge comprises a second end anchored relative to a mass which is movable relative to the substrate; this arrangement is particularly applicable in the case of a gauge in the form of a beam; as for the other end, the anchoring can be carried out by one end of the piezoresistive element.

It is specified that, within the scope of the present invention, the term "on" or "above" does not necessarily mean "in contact with". Thus, for example, the deposition of a layer on another layer does not necessarily mean that the two layers are directly in contact with each other, but this means that one of the layers at least partially covers the other by being, either directly in contact therewith, or by being separated therefrom by a film, or else another layer or another element. In particular, the strain gauge is suspended above one face of the substrate, which implies a space, generally filled with air, which is intermediate between said gauge and this face of the substrate. A layer can moreover be composed of several sub-layers of the same material or of different materials.

It is specified that within the scope of the present invention, the thickness of a layer or of the substrate is measured in a direction perpendicular to the surface along which this layer or this substrate has its maximum extension. If a layer is not totally flat, in particular because it has defects which are likely to be in relief on the exposed face of said layer, the thickness means the dimension of this layer outside its defects.

Some portions of the device of the invention can have an electrical function. Some are used for electrical conduction properties and elements which are formed of at least one material having sufficient electrical conductivity, in the application, are understood as having an electrically conductive nature, to achieve the desired function; this is in particular the case for a layer serving to form a conductive part or armature of a capacitor. Conversely, the term "electrical or dielectric insulator" means a material which, in the application, ensures an electrical insulation function; this is in particular the case for a layer used to form an intermediate insulator or air gap of a capacitor.

The terms "a substrate", "an element", "a layer" or other "based on" a material M means a substrate, an element, a layer comprising this material M only or this material M and possibly other materials, for example alloying elements, impurities or doping elements. Where appropriate, the material M can have different stoichiometries.

Figure 3:
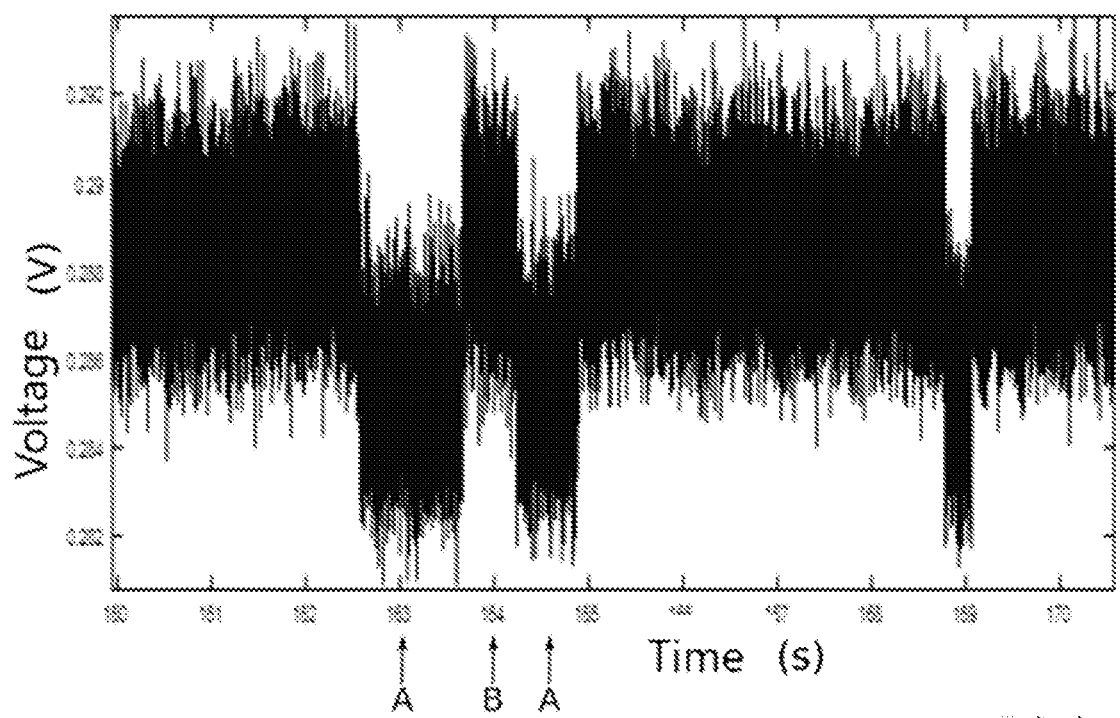
FIG. 3 illustrates the phenomenon of telegraph noise which can be caused by traps on the surface of the piezoresistive material, leading to phenomena of absorption and relaxation of charge carriers.

FIG. 3 reflects the telegraph noise in a nanogauge of piezoresistive nature having, for the example only, a dimension of 2×0.25×0.25 micrometers, made of doped silicon. It is noted that the voltage of the gauge, given on the ordinate, experiences jumps reflected by the drops in voltage in the phases marked A relative to the voltage level marked B, during the time given on the abscissa. In this example, the jump can correspond to a lowering of voltage of 4 mV. This variation is due to the absorption of a charge by a trap on the surface of the silicon absorbing, by tunnelling, the circulating charge carriers. When the number of traps is low, the signature of this type of noise is of the telegraph type, as shown in FIG. 3, because the absorptions and the relaxations are linked together individually. However, if the density of the traps increases, it is no longer possible to distinguish the variations of states linked to the absorptions and/or relaxations, and the noise spectral density is then in 1/f.

In general, the voltage variation levels $\Delta V$ identified in this phenomenon of absorption and relaxation of charges by a trap are inversely proportional to the electrical capacitance C formed between the gauge and the substrate. Indeed, the voltage variation is of the $\Delta V = q/C$ type, where q reflects the electric charge. Typically, for a gauge corresponding to the telegraph noise of FIG. 3, made of silicon, suspended above a substrate itself made of silicon, at a distance of 2 µm, the electrical capacitance may correspond to a value in the range of 30 to 40 aF (aF for $10^{-18}$ Farads).

Figure 4:
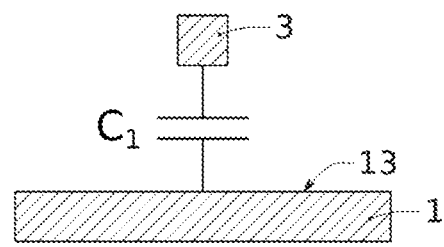
FIG. 4 schematises the capacitive effect existing between a gauge and the substrate above which the gauge is suspended.

FIG. 4 schematises the production of this capacitive effect of value Cl by the suspension of the gauge 3 above a face 13 of a substrate 1. In this simple example, the gauge can for example be made of doped silicon and the face of the substrate also correspond to a semiconductor material of silicon type. The intermediate insulator of these two conductive parts is then formed by an air layer.

In view of this observation, it is proposed herein to increase the electrical capacitance of the gauge 3 relative to the substrate 1, so as to reduce the influence of the phenomena linked to the charge trap in the gauge 3.

In general, the gauge 3 is improved by the constitution of at least one additional capacitor element, such that the overall capacitance relative to the substrate is increased.

Figure 5A:
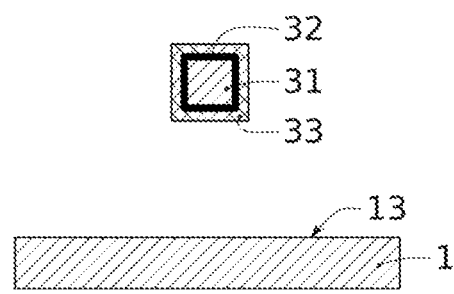
FIGS. 5A and 5B represent respectively a first embodiment of the invention and a schematisation of the electrical capacitances induced by this embodiment.

FIG. 5A provides a first example of a gauge structure in one embodiment of the invention. This illustration typically corresponds to a section along a section transverse to the longitudinal axis of the gauge 3, which corresponds to a cross-section perpendicular to the direction Y shown in FIG. 1. Except for the presence of the stack detailed below, the given description of FIG. 1 is applicable to the embodiment of the invention.

The gauge 3 first has a piezoresistive element 31. The latter can in particular be made from quartz or, more commonly, silicon, preferably doped in order to reduce the resistivity thereof. This piezoresistive element 31 may conform to a conventional piezoresistive gauge.

As in the case of the gauge 3 of the prior art shown in FIG. 1, the piezoresistive element 31 can thus extend integrally between two anchoring ends 36, 37. The square section represented in FIG. 5A is not limiting; in particular, other polygonal, and in particular rectangular, sections are possible.

In one embodiment, the element 31 is a beam, preferably of rectangular cross section, whose long dimension is directed in the direction Y of FIG. 1. A circular section is also possible. Nevertheless, other geometric shapes are possible, in particular a membrane.

The resistive element 31 overhangs a face 13 of the substrate 1. The latter can be made of silicon, possibly with a surface oxide layer, which is native or not, defining the surface 13.

In one embodiment, the suspension of the piezoresistive element 31 is produced as follows: the element 31 is defined on the surface of the substrate, for example in a monocrystalline silicon layer (for example the upper layer of a silicon-on-insulator type substrate); then the underlying layer (for example the insulating material of a silicon-on-insulator type substrate) is attacked by etching to produce the release of the element 31. This etching is laterally limited so as to preserve at least one anchoring of the element 31 relative to the substrate 1. The face 13 of the substrate 20 can be formed by the surface of a residual portion of the layer which has been the object of the etch attack, typically an insulating material, such as silicon oxide. It can also be formed by the surface of a layer which is initially located under the insulator layer or else by the surface of a subsequently added layer, or else by the surface of an oxide layer which is naturally formed after the release of the element 31.

Characteristically, the piezoresistive element 31 thus suspended is covered by a stack including successively a dielectric layer 32 and an electrically conductive layer 33. This coverage is not necessarily complete, over the entire outer surface of the resistive element 31. However, preferably, this cover extends continuously over the entire length of the resistive element 31. In the preferred case where the piezoresistive element 31 has a polygonal section, the cover extends therefore preferably over the whole of at least one of the sides of this section.

In the case of FIG. 5A, in cross section, the stack formed by the layers 32, 33 cover the entire periphery of the resistive element 31, forming a closed outline around the latter. Thus, an upper portion of the stack leads to the formation of an upper capacitor with the resistive element 31, a lower portion of the stack leads to the formation of a lower capacitor with the resistive element 31 and two lateral portions of the stack lead to the formation of lateral capacitors with the resistive element 31, to the left and to the right of the latter.

Figure 5B:
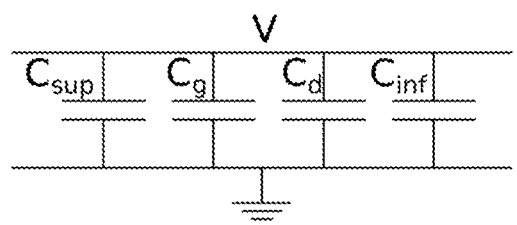

In this context, as shown in FIG. 5B, the structure of the gauge 3 of FIG. 5A induces the paralleling of a plurality of capacitors each having a capacitive value. More particularly, there are associated: a capacitance Csup corresponding to the upper capacitor, a capacitance Cinf corresponding to the lower capacitor, a capacitor Cg corresponding to the left capacitor and a capacitance Cd corresponding to the right capacitor. This association leads to a significant increase in the capacitance value separating the gauge from the substrate.

Figure 6A:
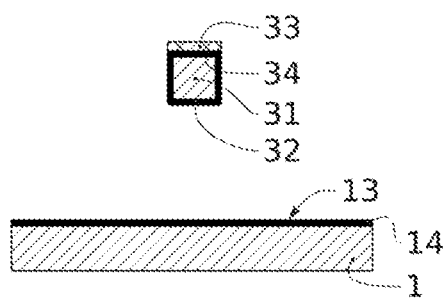
FIGS. 6A and 6B represent respectively a second embodiment of the invention and a schematisation of the electrical capacitances induced by this embodiment.

FIG. 6A represents a variant. In an accessory manner, it is represented that the face 13 of the substrate 20 can be formed by the surface of a surface insulating layer 14, it being reminded that this possibility was also valid in the previous case.

However, a single capacitor is produced by the stacking of layers 31, 32 in this case. Indeed, in this example, the dielectric layer 32 still runs through the entire outline of the resistive element 31. However, the electrically conductive layer 33 herein only surmounts the face 34 of the piezosistive element 31, opposite to the substrate 1. In an embodiment which is not represented, the dielectric layer 32 covers only the face 34 of the piezoresistive element 31.

Figure 6B:
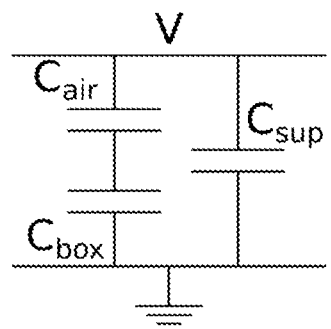

In the structural context of FIG. 6A, the capacitive effect produced between the gauge 3 and the substrate 1 corresponds to the diagram of FIG. 6B and is associated with, in parallel, a capacitor corresponding to the upper capacitor produced by the piezoresistive element 31, the layer 32 and the layer 33, and a capacitor corresponding to the usual situation, previously schematised in FIG. 4, herein implementing an intermediate insulator in the form of an air layer and an oxide layer, and schematised by the capacitances Cair and Cbox.

Figure 7A:
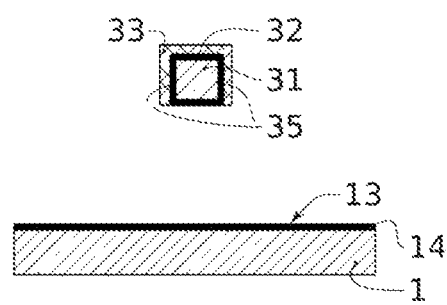
FIGS. 7A and 7B represent respectively a third embodiment of the invention and a schematisation of the electrical capacitances induced by this embodiment.

FIG. 7A gives another embodiment in which the stacking of the layers 32, 33 is only effective on three sides of the piezoresistive element 31. In this example, the dielectric layer 32 again covers the entire outline of the piezoresistive element 31, while reminding that this situation is not limiting. The electrically conductive layer 33 coats only the upper face 34 of the piezoresistive element 31 and the lateral flanks, excluding the lower face of the resistive element 31.

Figure 7B:
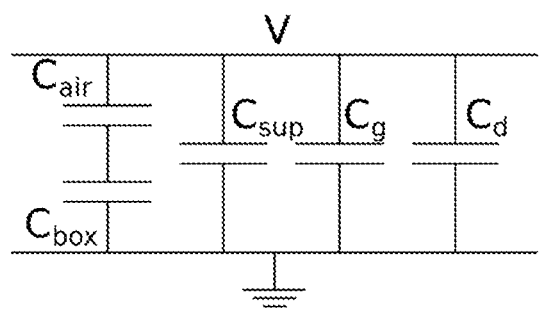

Compared to the situation of FIG. 6A, this leads to the formation of a right lateral capacitor and a left lateral capacitor. Thus, the schematisation of the electrical capacitances given in FIG. 7B for this embodiment differs from the representation of FIG. 6B in that capacitances Cg and Cd are added in parallel, corresponding respectively to the left capacitor and to the right capacitor.

It is understood that the embodiment of FIG. 5A provides the greatest increase in capacity. The case of FIG. 6A is the most degraded, and that of FIG. 7A is intermediate.

Other embodiments come within the scope of the present invention and in particular the following:

the stack may cover only one and/or the other of the flanks of the resistive element 31 so as to form only the left capacitor and/or the right capacitor; and the stack may cover only the lower face of the piezoresistive element 31, located opposite to the face 13 of the substrate.

The shape of the cross section of the stack can moreover vary depending on the length dimension of the resistive element 31. For example, only the upper face of the piezoresistive element can be covered by the stack on a part of the length of the piezoresistive element 31 while the flanks are also covered over another part of the length of this element. Any other arrangement, along the length of the gauge, of parts covered by the stack that this example is possible. The stack can be discontinuous along this length, even if this is not preferred to promote the increase in the capacitance.

The suspended piezoresistive element can be obtained in a conventional manner, and in particular by following the example of the release by etching which is previously given. Preferably, the stack of layers 32, 33 is formed after the formation of the suspended piezoresistive element 31. For example, the layer 32 can be produced by a surface oxidation or nitriding of the material of the piezoresistive element 31. This can for example lead to a silicon nitride or silicon oxide layer. By way of example, the thickness dimension of the layer 32 may be comprised between 3 and 15 nanometers, and for example be 5 nm.

In this context, the layer 32 will generally cover the entire outline of the piezoresistive element 31.

The electrically conductive layer 33 may for example be made of silicon, preferably doped, or else of a sufficiently conductive metal material. It can be produced by deposition using conventional deposition techniques. The parts on which the deposition is not desired will typically be previously masked. The stacking is only effective on the parts of the layer 32 which are covered by the layer 33.

The thickness of the layer 32 is not limited, but it may be advantageous that it remains less than a few tens of nanometers, preferably less than 20 nm. It may for example be comprised between 3 and 10 nanometers, and in particular be equal to 5 nm.

Similar values are possible for the layer 33.

In one embodiment, the aim is to ensure that the construction of the stack does not fundamentally change the mechanical behaviour of the gauge. In particular, it is possible to arrange for the stack to provide a low increase in rigidity of the gauge relative to the intrinsic rigidity of the piezoresistive element 31. In this context, for example, the thickness of the stack may, at the global, be less than 10% of the largest dimension of the section of the resistive element (typically the width or length of the section).

In an example corresponding to a gauge 3 comprising a piezoresistive element running through the entire length thereof, set at 2 µm, having a square section of element 31 of 0.25 µm×0.25 µm, and a dielectric layer thickness 32 of 5 nm, by considering an initial capacitance of 40 aF, one could multiply the final capacitance by a factor of 266, 66 and 199 respectively in the cases of FIGS. 5A, 6A and 7A.

Of course, the gain in terms of noise is much larger than the resistive element 31 is of high dimensions, insofar as the stack 32, 33 leads to a capacitor having a larger value than the surface area it covers is high.

Figure 8A:
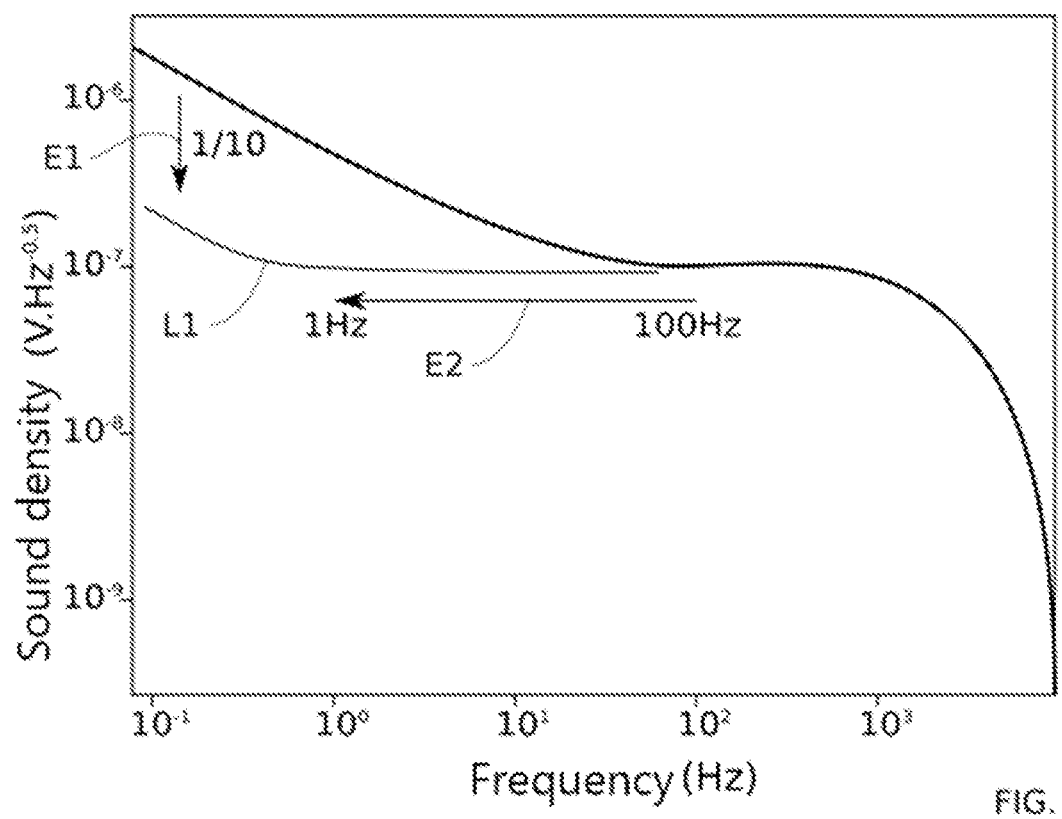
FIG. 8A reflects a modelling of the effect of the invention on noise spectral density, in the present case for an accelerometer.
Figure 8B:
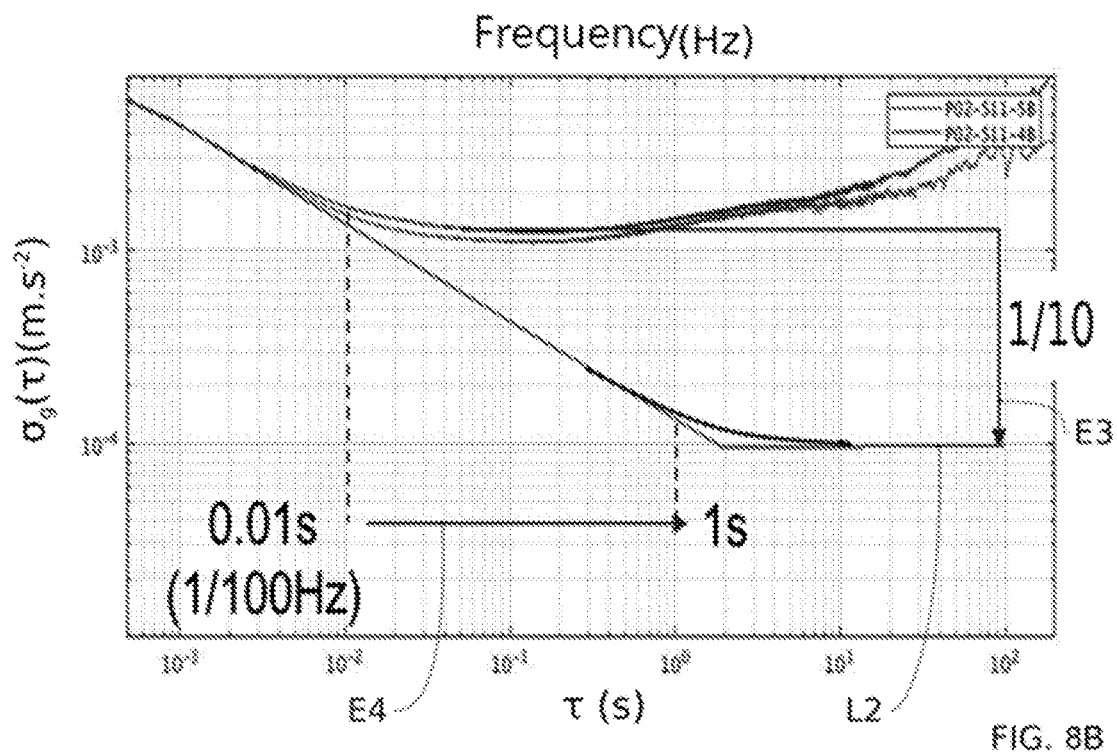
FIG. 8B shows a modelling of the effect of the invention on the Allan standard deviation of this same accelerometer.

FIGS. 8A and 8B reflect the very beneficial effect of the invention on the reduction of noise of the piezoresistive sensors. They are part of a context of implementation of an accelerometer type device corresponding to that of FIG. 6A (which is not the most favourable), with a gauge 3 comprising a piezoresistive element 31 running through the entire length thereof, set at 2 µm, having a square section of element 31 of 0.25 µm×0.25 µm, and a dielectric layer thickness 32 of 5 nm, considering an initial capacitance of 40 aF.

In the case of FIG. 8A, the spectral density of the noise is given on the ordinate depending on the frequency given on the abscissa with measurement results corresponding to a conventional accelerometer, without implementation of the invention. One notes the impact of 1/f noise in the low frequencies, then a bearing from which it is thermomechanical noise (white noise) which is imposed.

This figure also shows a curve L1 modelling the change in the noise thanks to the invention with, as reflected by the arrow E1, a reduction in noise by a factor of 10 at low frequency. The arrow E2 shows the frequency offset (herein of two decades) of the low frequency part on which the 1/f noise is very penalising, making this type of noise equal to the mechanical term noise much earlier in frequency.

FIG. 8B shows a modelling of the invention in its effect on Allan variance. As for the previous figure, measured values appear (corresponding to a traditional sensor) as well as a modelling to the curve L2 by implementing the invention. The point where the low frequency noise is equal to the thermomechanical noise is offset from 0.01 seconds to one second as shown by the arrow E4, which enables much higher acquisition times with a satisfactory resolution. The Allan variance is itself reduced by a factor of 10 as shown by the arrow E3; the resolution of the sensor is therefore increased by a factor of 10.

Although applicable to all types of sensors, those which use piezoresistive gauges on a bandwidth starting at low frequencies, and potentially from 0 Hz, benefit greatly from the invention.

These can be pressure sensors, magnetometers or microphones.

The invention is not limited to the previously described embodiments and extends to all embodiments covered by the claims.

The invention claimed is:

1. A transduction detection device, comprising
a substrate, and
a strain gauge suspended above a face of the substrate and comprising a piezoresistive element, wherein
the strain gauge comprises a first end anchored relative to the substrate and a second end anchored relative to a mass which is movable relative to the substrate,
at least one portion of a surface of the piezoresistive element is covered by a stack comprising, successively from the surface of the piezoresistive element, a dielectric layer and an electrically conductive layer, and
the electrically conductive layer is electrically isolated from the piezoresistive element, wherein
the piezoresistive element comprises a first face disposed opposite the face of the substrate, a second face disposed opposite the first face, a third face oriented in a first direction crossing a direction of the first face, and a fourth face oriented in a second direction crossing the direction of the first face,
the dielectric layer is disposed on each of the first, second, third and fourth faces, and
the electrically conductive layer is disposed opposing the second, third and fourth faces or is disposed opposing each of the first, second, third and fourth faces.

2. The device according to claim 1, wherein an electrical capacitance formed by the piezoresistive element and the stack has a value greater than that of an electrical capacitance formed between the piezoresistive element and the substrate.

3. The device according to claim 1, wherein the piezoresistive element is positioned between the stack on the at least one portion and the face of the substrate.

4. The device according to claim 1, wherein the at least one portion comprises a surface portion of the piezoresistive element facing the face of the substrate.

5. The device according to claim 1, wherein the piezoresistive element is a beam.

6. The device according to claim 5, wherein the at least one portion comprises a surface portion located on at least one flank of the beam.

7. The device according to claim 1, wherein the stack extends along an entire length dimension of the piezoresistive element.

8. The device according to claim 1, wherein the dielectric layer is made of a material based on silicon oxide or nitride.

9. The device according to claim 1, wherein the electrically conductive layer is based on doped silicon or a metal.

10. The device according to claim 1, wherein the dielectric layer surrounds the piezoresistive element.

11. The device according to claim 1, wherein the dielectric layer is disposed directly on the piezoresistive element and the electrically conductive layer is disposed directly on the dielectric layer.

12. The device according to claim 1, wherein a thickness of the dielectric layer is smaller than a thickness of the piezoresistive element.

* * * * *